(12) United States Patent
Wills et al.

(10) Patent No.: US 11,726,311 B2
(45) Date of Patent: Aug. 15, 2023

(54) ELECTRODE CONFIGURATION FOR TILTING MICRO-ELECTRO-MECHANICAL SYSTEMS MIRROR

(71) Applicant: Lumentum Operations LLC, San Jose, CA (US)

(72) Inventors: Gonzalo Wills, Ottawa (CA); Wenlin Jin, Ottawa (CA); Jason Blechta, Ottawa (CA); Shane H. Woodside, Ottawa (CA)

(73) Assignee: Lumentum Operations LLC, San Jose, CA (US)

( * ) Notice: Subject to any disclaimer, the term of this patent is extended or adjusted under 35 U.S.C. 154(b) by 284 days.

(21) Appl. No.: 17/247,093

(22) Filed: Nov. 30, 2020

(65) Prior Publication Data
US 2022/0099958 A1   Mar. 31, 2022

Related U.S. Application Data

(60) Provisional application No. 63/198,047, filed on Sep. 25, 2020.

(51) Int. Cl.
*G02B 26/08* (2006.01)
*B81B 3/00* (2006.01)

(52) U.S. Cl.
CPC ........ *G02B 26/0841* (2013.01); *B81B 3/0083* (2013.01); *B81B 2201/042* (2013.01); *B81B 2203/0307* (2013.01); *B81B 2203/04* (2013.01); *B81B 2203/058* (2013.01)

(58) Field of Classification Search
CPC .............. G02B 26/0841; B81B 3/0083; B81B 2201/042; B81B 2203/0307; B81B 2203/04; B81B 2203/058
USPC ......... 359/198.1, 199.2, 212.1, 212.2, 223.1, 359/224.1, 225.1, 226.1, 290, 295, 298
See application file for complete search history.

(56) References Cited

U.S. PATENT DOCUMENTS 6,906,849 B1 * 6/2005 Mi ..................... G02B 26/0841
359/223.1

* cited by examiner

*Primary Examiner* — William Choi
(74) *Attorney, Agent, or Firm* — Harrity & Harrity, LLP

(57) ABSTRACT

A micro-electro-mechanical system (MEMS) device may include a mirror structure suspended from a first hinge and a second hinge that are arranged to enable the mirror structure to be tilted about a tilt axis. The mirror structure may include a first actuator and a second actuator located on opposite sides of the tilt axis. The MEMS device may include a fixed electrode coupled to first actuator to cause the mirror structure to tilt about the tilt axis in a first direction based on a fixed voltage applied to the fixed electrode. The MEMS device includes a driving electrode coupled to the second actuator to cause the mirror structure to tilt about the tilt axis in a second direction opposite from the first direction based on a driving voltage applied to the driving electrode.

20 Claims, 5 Drawing Sheets

ELECTRODE CONFIGURATION FOR TILTING MICRO-ELECTRO-MECHANICAL SYSTEMS MIRROR

CROSS-REFERENCE TO RELATED APPLICATION

This application claims priority to U.S. Provisional Patent Application No. 63/198,047, filed on Sep. 25, 2020, and entitled "ELECTRODE CONFIGURATION FOR TILTING MICROELECTROMECHANICAL SYSTEM (MEMS) MIRROR," the content of which is incorporated by reference herein in its entirety.

TECHNICAL FIELD

The present disclosure relates to a micro-electro-mechanical systems (MEMS) device that includes a mirror structure and one or more hinges to tilt the mirror structure about a tilt axis, and to an electrode configuration to increase an angular tilt range of the mirror structure using a single driving channel and/or a single controllable driving voltage.

BACKGROUND

A micro-electro-mechanical systems (MEMS) device is a micro-sized structure that has electronic and mechanical components and physical dimensions that may range from several millimeters to less than one micrometer. For example, a MEMS device may include a mirror that can be used to reflect or otherwise direct light (e.g., a laser beam) in various applications, such as a light detection and ranging (LIDAR) application, a sensing application, and/or an optical communications application, among other examples. In operation, a MEMS driver circuit may actuate the MEMS device, which may cause the mirror to be tilted about one or more axes in order to change a direction in which the light is directed by the mirror. For example, actuating the MEMS device to tilt the mirror may cause an optical beam that was falling upon the mirror and reflecting in one direction to be reflected in a different direction.

SUMMARY

In some implementations, a micro-electro-mechanical systems (MEMS) device includes a mirror structure suspended from a first hinge and a second hinge that are arranged to enable the mirror structure to be tilted about a tilt axis, wherein the mirror structure comprises a first actuator and a second actuator located on opposite sides of the tilt axis; a fixed electrode, coupled to first actuator, to cause the mirror structure to tilt about the tilt axis in a first direction based on a fixed voltage applied to the fixed electrode; and a driving electrode, coupled to the second actuator, to cause the mirror structure to tilt about the tilt axis in a second direction that is opposite from the first direction based on a driving voltage applied to the driving electrode.

In some implementations, a method includes applying a fixed voltage to a fixed electrode of a MEMS device including a mirror structure, wherein the mirror structure comprises a first actuator and a second actuator that are located on opposite sides of a tilt axis, and wherein applying the fixed voltage to the fixed electrode causes the first actuator to tilt the mirror structure about the tilt axis in a first direction; and applying, to a driving electrode of the MEMS device, a driving voltage that causes the second actuator to tilt the mirror structure about the tilt axis in a second direction that is opposite from the first direction based on the driving voltage applied to the driving electrode.

In some implementations, a MEMS device includes a mirror structure configured to be tilted about a tilt axis; a first actuator, located on a first side of the tilt axis, configured to cause the mirror structure to tilt about the tilt axis by a first angle in a first direction based on a pre-tilt voltage applied to the first actuator; and a driving channel comprising a second actuator, located on a second side of the tilt axis, configured to cause the mirror structure to tilt about the tilt axis by a second angle in a second direction that is opposite from the first direction based on a driving voltage applied to a driving electrode provided in the driving channel, wherein the mirror structure has a tilt range that is based on the pre-tilt voltage and a maximum value of the driving voltage.

DETAILED DESCRIPTION

Figure 1A:
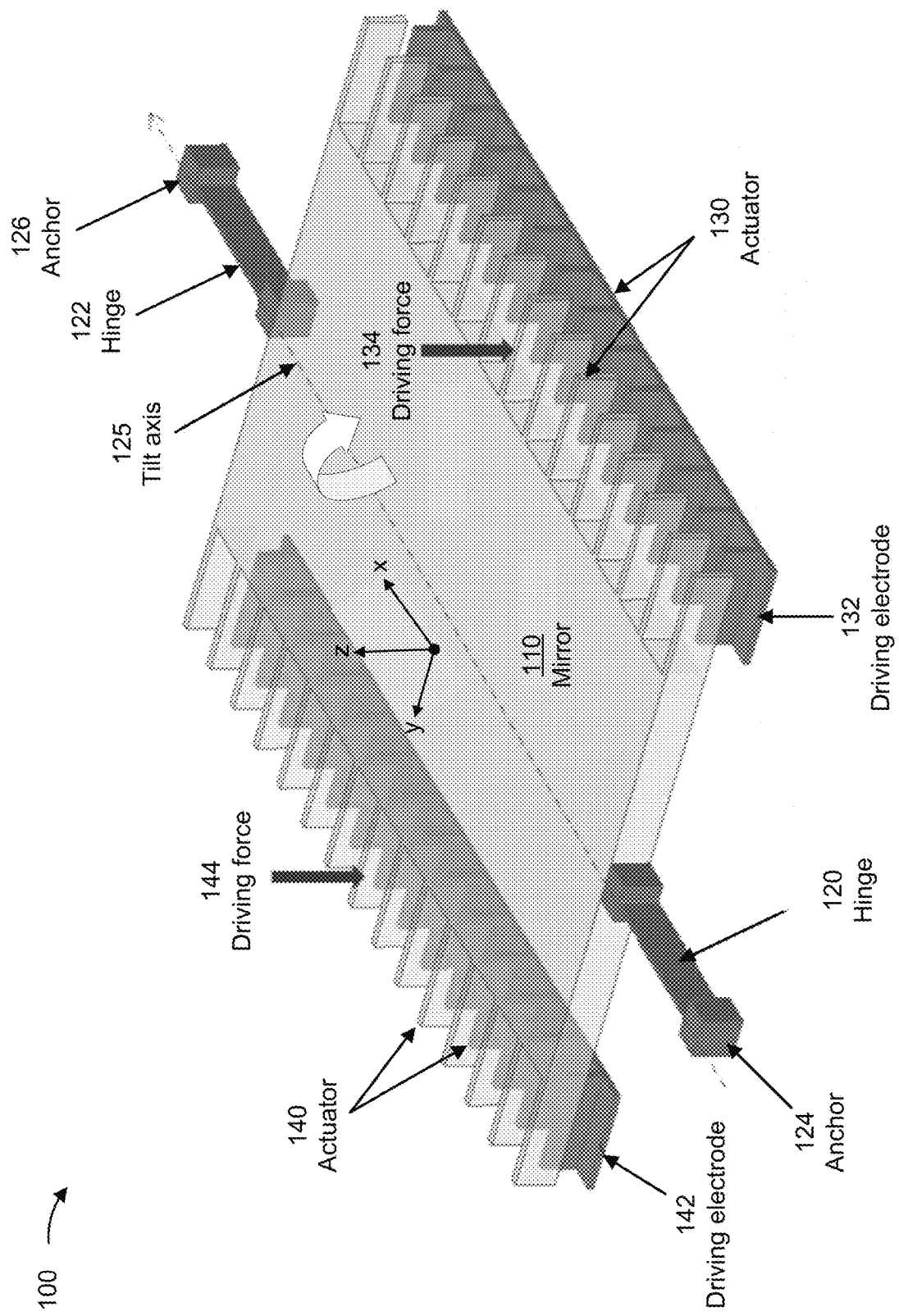
FIGS. 1A-1B are diagrams of one or more example implementations of a micro-electro-mechanical systems (MEMS) device that includes a tilting mirror structure.

The following detailed description of example implementations refers to the accompanying drawings. The same reference numbers in different drawings may identify the same or similar elements.

In a light detection and ranging (LIDAR) system, an object can be detected by illuminating the object with an optical beam (e.g., a laser beam) and measuring characteristics of a reflected optical beam. A vehicle, such as a semiautonomous or fully autonomous vehicle, may use a LIDAR system to detect objects (e.g., other vehicles, pedestrians, and/or road debris, among other examples) in a path of the vehicle. A typical LIDAR system includes a beam deflection unit that deflects both projected optical beams and reflected optical beams. However, the beam deflection unit spins in place and is therefore subject to mechanical wear and tear due to friction and/or abrasion, among other examples. Accordingly, for many applications, such as autonomous vehicle applications, a more robust solid-state LIDAR system is desired.

In some cases, a solid-state LIDAR system may use one or more MEMS devices that include respective mirrors to reflect, deflect, or otherwise direct projected optical beams and reflected optical beams in a controlled manner. For example, the one or more MEMS devices may be coupled to a MEMS driver circuit that can actuate the MEMS device(s), which may cause the mirror(s) to be tilted about one or more axes to control a direction in which the light is directed by the mirror(s). In order to provide a long range and a wide field-of-view in such a LIDAR system, the MEMS device(s) of the LIDAR system should enable a wide tilt range for the mirror(s) to provide wide deflection angles. For example, increasing the mirror tilt range is generally desirable because a wider tilt range allows access to a larger number of ports associated with the LIDAR system. For example, in a LIDAR system and/or another suitable sensing system, a light beam may fall upon the mirror of a MEMS device, which can be tilted to different angles in order to steer the light toward different ports. Accordingly, because the amount of steer is proportional to the number of ports, a larger mirror tilt range can allow the light beam to be steered at larger angles to thereby access a larger number of ports, which may improve sensing performance (e.g., increasing a sensing range and/or sensing precision).

Some implementations described herein relate to an electrode configuration that enables a wide angular tilt range for a MEMS device that includes a mirror structure to reflect light based on an angle at which the mirror structure is tilted about a tilt axis. For example, in some implementations, the mirror structure may be suspended from one or more hinges that enable the mirror structure to be tilted about the tilt axis, and the mirror structure may include a first actuator and a second actuator located on opposite sides of the tilt axis. Accordingly, when a first voltage is applied to a first electrode coupled to the first actuator, the first voltage may generate a force that causes the mirror structure to be tilted about the tilt axis in a first direction, and the mirror structure may be tilted about the tilt axis in a second direction when a second voltage is applied to a second electrode coupled to the second actuator. In this way, the tilt range of the mirror structure may be increased (e.g., doubled) relative to a single electrode design. Furthermore, in some implementations, the first electrode may be a fixed electrode and the second electrode may be a driving electrode, which may enable the increased tilt range to be achieved with a single driving voltage and/or a single driving channel, which reduces a cost for the MEMS device because only a single controllable voltage is needed to increase the tilt range.

Figure 1B:
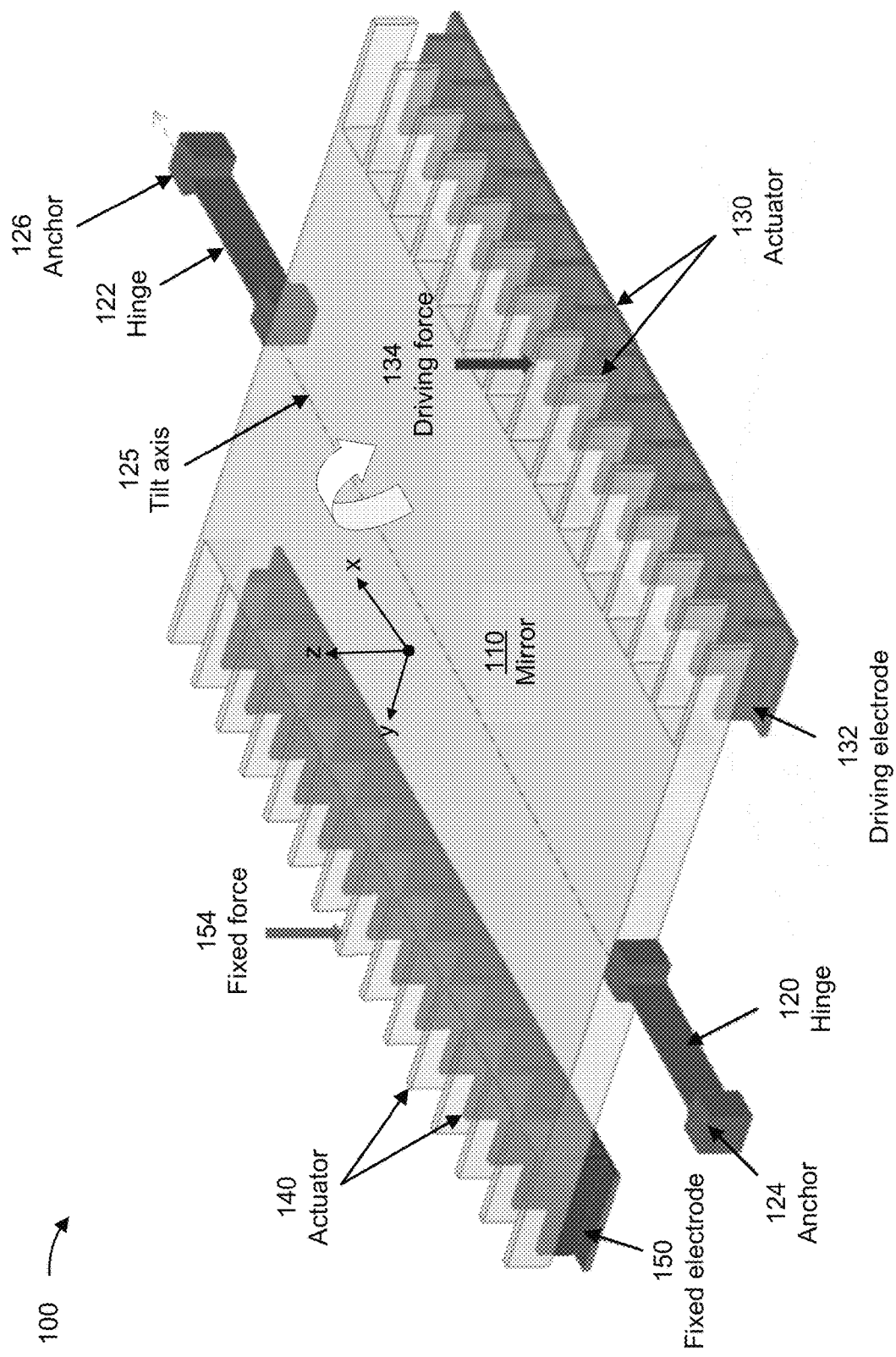

FIGS. 1A-1B are diagrams of one or more example implementations 100 of a MEMS device that includes a tilting mirror structure 110. In some implementations, as described herein, the MEMS device may be a micro-sized optical device configured to deflect optical beams (e.g., light beams) that fall upon the mirror structure 110 based on an angle at which the mirror structure 110 is tilted about a tilt axis 125. For example, at least a portion of the mirror structure 110 may be coated with a reflective coating (e.g., a metallic reflective material, such as gold or another suitable material) for reflecting optical beams. Furthermore, as described in further detail herein, the MEMS device may include an electrode configuration to increase an angular tilt range of the mirror structure 110 (e.g., relative to a MEMS device with a single electrode). For example, as shown in FIGS. 1A-1B and described in further detail herein, the MEMS device may include an electrode configuration with two (2) electrodes to increase (e.g., double) the angular tilt range of the mirror structure 110 relative to a MEMS device with a single electrode. For example, as shown in FIG. 1A, the MEMS device may include two driving electrodes that are separately controlled. Alternatively, as shown in FIG. 1B, the MEMS device may include a fixed electrode and a driving electrode to achieve a similar increase in the angular tilt range of the mirror structure 110 using a single driving channel and/or a single controllable driving voltage.

In some implementations, as shown in FIG. 1A and FIG. 1B, the mirror structure 110 may be suspended via a pair of hinges 120, 122 that are arranged or otherwise configured to tilt the mirror structure 110 (or to allow or enable the mirror structure 110 to be tilted) about a tilt axis 125 of the MEMS device (e.g., the x-axis shown in FIGS. 1A-1B). For example, the hinges 120, 122 may be aligned along the tilt axis 125 allow the mirror structure 110 to tilt about the tilt axis 125 in a first direction (e.g., a clockwise direction) and a second direction (e.g., a counter-clockwise direction). As further shown in FIGS. 1A-1B, the hinges 120, 122 may be mechanically mounted via respective anchors 124, 126. For example, in some implementations, the anchors 124, 126 may be mounted to an enclosure or housing or to one or more mechanical elements within the enclosure or housing to stabilize the mirror structure 110 as the mirror structure 110 tilts on the hinges 120, 122 about the tilt axis 125.

In some implementations, as shown in FIG. 1A and FIG. 1B, the MEMS device may include a first actuator 130 and a second actuator 140 located on opposite sides of the tilt axis 125. For example, in FIG. 1A and FIG. 1B, the first actuator 130 is located in the negative y-direction relative to the tilt axis 125 aligned in the x-direction and the second actuator 140 is located in the positive y-direction relative to the tilt axis 125. In some implementations, as shown in FIG. 1A and FIG. 1B, the first actuator 130 and the second actuator 140 may be comb drive actuators that are configured to generate an electrostatic torque (also referred to as a driving force or a driving torque) to tilt the mirror structure 110 about the tilt axis 125. For example, a comb drive actuator may include a set of stator (e.g., stationary or fixed) combs and a set of rotor combs, each of which include various teeth that engage with one another to generate the electrostatic torque to tilt the mirror structure. For example, when a voltage is applied to the set of stator combs, a voltage difference between the rotor combs and the stator combs creates an electrostatic field that causes (e.g., pulls) the teeth of the rotor combs to engage with the teeth of the stator combs. The electrostatic field may generate a linear electrostatic force in a direction orthogonal to the tilt axis 125 (e.g., the z-axis shown in FIG. 1A and FIG. 1B) and/or electrostatic torque about the tilt axis 125 (e.g., shown as a curved arrow in FIG. 1A and FIG. 1B) that causes the mirror structure 110 to tilt about the tilt axis 125. Alternatively, in some implementations, the first actuator 130 and the second actuator 140 may be a pair of electrostatic parallel plates, including a first plate that is stationary or fixed and a second plate that is able to move toward or away from the first plate based on a voltage applied to the stationary or fixed plate.

In some implementations, as shown in FIG. 1A, the MEMS device may include a first driving electrode 132 and a second driving electrode 142 that are separately controlled in order to increase (e.g., double) the angular tilt range of the mirror structure 110 relative to a MEMS device with a single electrode. For example, the first driving electrode 132 may be coupled to the first actuator 130 (e.g., to a stationary or fixed of the first actuator 130, such as a set of stator combs or a first parallel plate), whereby applying a driving voltage to the first driving electrode 132 generates a driving force 134 on the right side of the tilt axis 125 (e.g., in the negative y-direction relative to the tilt axis 125 that is oriented in the x-direction). The driving force 134 causes the mirror structure 110 to tilt about the tilt axis 125 in a first direction (e.g., clockwise) by a first angle (positive θ). Similarly, the second driving electrode 142 may be coupled to the second actuator 140 (e.g., to a stationary or fixed of the second actuator 140, such as a set of stator combs or a first parallel plate), whereby applying a driving voltage to the second driving electrode 142 generates a driving force 144 on the left side of the tilt axis 125 (e.g., in the positive y-direction relative to the tilt axis 125). In this way, the driving force 144 causes the mirror structure 110 to tilt about the tilt axis 125 in a second direction (e.g., counter-clockwise) by a second angle (negative θ), resulting in a total tilt range of ±θ, or double the tilt range that can be achieved with a single electrode.

In some implementations, in order to supply the two driving voltages to the first driving electrode 132 and the second driving electrode 142, the MEMS device as shown in FIG. 1A may include two driving channels with input/output (I/O) ports to connect to digital to analog (DAC) converters that supply the two driving voltages. In other words, in order to separately control the first actuator 130 and the second actuator 140 using different driving electrodes 132, 142, two controllable driving voltages are needed to double the angular tilt range of the mirror structure 110, which also doubles a number of driving channels, I/O ports, and/or DAC converters that are used to achieve the doubled angular tilt range. In a case where the MEMS device is used in a LIDAR system, a wavelength selective switch, and/or the like, there may be an array including a large number of MEMS devices and correspond mirror structures (e.g., 100 or more). Accordingly, doubling the number of driving channels, I/O ports, and/or DAC converters can significantly increase the cost to achieve the wider tilt range. Furthermore, using two separate driving channels can increase design complexity. For example, as described above, the MEMS device may be mechanically mounted to a hermetic enclosure or housing, or to one or more mechanical elements within a hermetic enclosure or housing. Accordingly, each driving channel may need an I/O port to access a driving electrode and a DAC to control the corresponding driving electrode, which can lead to mechanical complexity in a micro-sized MEMS device.

Accordingly, as shown in FIG. 1B, a MEMS device may include an electrode configuration that enables a similar increase in angular tilt range using a single driving channel and/or a single controllable driving voltage. For example, as shown in FIG. 1B, the second actuator 140 may be coupled to a fixed electrode 150, and a fixed voltage is applied to the fixed electrode 150 to generate a fixed force 154 to tilt the mirror structure 110 in a direction towards the fixed electrode 150 (e.g., in a counter-clockwise direction about the tilt axis 125). The fixed voltage causes the mirror structure 110 to be tilted towards the fixed electrode 150 by a fixed pre-tilt angle ($\theta_{pre}$) when no voltage is applied to the driving electrode 132. Additionally, or alternatively, a negative bias voltage may be applied to a membrane of the mirror structure 110 to increase an actuation angle and/or decrease the fixed voltage that needs to be applied to the fixed electrode 150. For example, in this case, an effective pre-tilt voltage that causes the mirror structure 110 to tilt by the pre-tilt angle may be a sum of the negative bias voltage applied to the membrane of the mirror structure 110 and the fixed voltage applied to the fixed electrode 150. Alternatively, the negative bias voltage may be applied to the membrane of the mirror structure 110 without a fixed voltage to reduce the value of the pre-tilt angle. In either case, a driving voltage may be applied to the driving electrode 132 in a similar manner as described above with respect to FIG. 1A, and the driving voltage may create the driving force 134 to cause the mirror structure 110 to be tilted towards the driving electrode 132. In this case, the driving force 134 may tilt the mirror structure 110 towards the driving electrode 132 monotonically relative to the pre-tilt angle (e.g., in a clockwise direction), up to a maximum angle based on a maximum value of the driving voltage. In this way, the tilt range for the mirror structure 110 may be increased using a single controllable driving voltage, thereby reducing the number driving channels, I/O ports, and/or DACs needed to achieve the full tilt range.

In some implementations, a driving efficiency for the driving electrode 132 may vary depending on the fixed pre-tilt angle at which the mirror structure 110 is tilted by the fixed voltage applied to the fixed electrode 150. For example, the driving efficiency for the driving electrode 132 may be reduced as the value of the fixed pre-tilt angle increases. Accordingly, in some implementations, driving efficiency may be increased by optimizing one or more parameters of the MEMS device to limit the value of the fixed pre-tilt angle. For example, in some implementations, a value of the fixed voltage may be increased to increase the pre-tilt angle (at the cost of a reduction in driving efficiency) or decreased to decrease the pre-tilt angle (and thereby improve driving efficiency). Additionally, or alternatively, a stiffness of one or more of the hinges 120, 122 may be optimized to improve driving efficiency (e.g., decreasing the stiffness of one or more of the hinges 120, 122 may reduce the driving voltage that is needed to tilt the mirror structure 110 to a desired angle within the overall tilt range). Additionally, or alternatively, a location and/or geometry of the first actuator 130 and/or the second actuator 140 may be adjusted to increase the driving efficiency.

As indicated above, FIGS. 1A-1B are provided as one or more examples. Other examples may differ from what is described with regard to FIGS. 1A-1B.

Figure 2:
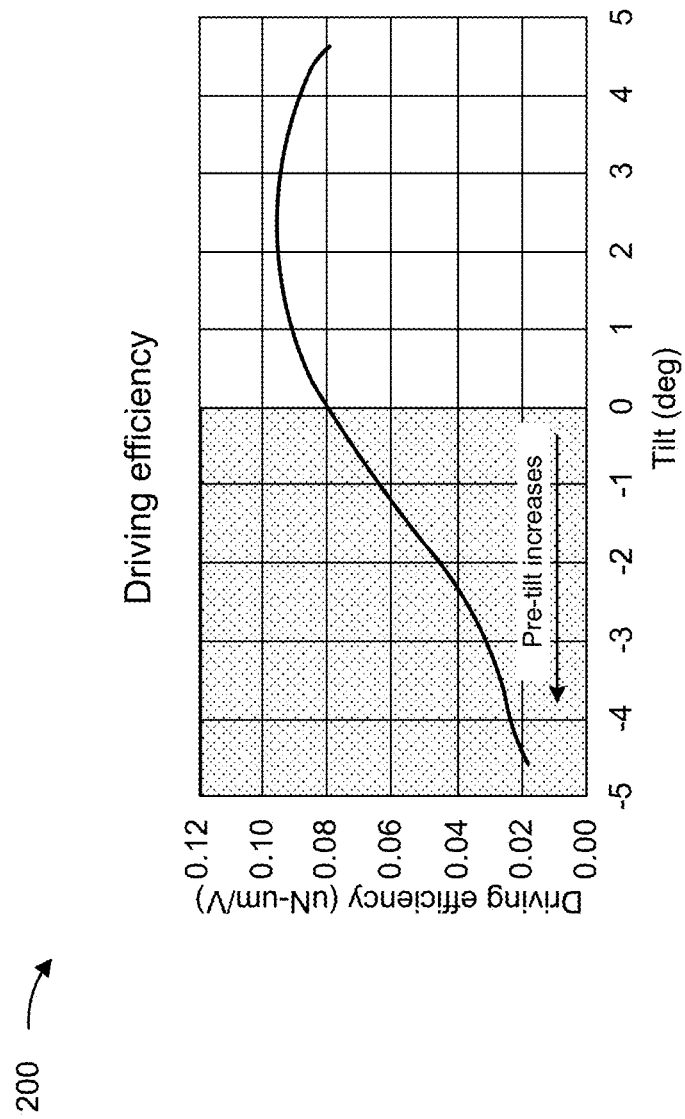
FIG. 2 is a plot of an example relationship between driving efficiency and a tilt angle associated with a mirror structure of a MEMS device described herein.

FIG. 2 is a plot 200 of an example relationship between driving efficiency and a tilt angle associated with a mirror structure of a MEMS device described herein. For example, plot 200 illustrates driving efficiency in a MEMS device that includes a first actuator (e.g., electrostatic combs or parallel plates) that is coupled to a fixed electrode on a first side of a tilt axis, whereby a fixed voltage that is applied to the fixed electrode causes the first actuator to rotate or otherwise tilt a mirror structure about a tilt axis by a pre-tilt angle. When a driving voltage is applied to a driving electrode coupled to a driving electrode on a second side of the tilt axis, the driving voltage applied to the driving electrode causes a second actuator to rotate or otherwise tilt the mirror structure about the tilt axis monotonically, away from the pre-tilt angle.

Accordingly, as plot 200 generally illustrates that the driving efficiency decreases as the pre-tilt angle increases, one or more design parameters of the MEMS device may be optimized to limit the pre-tilt angle and thereby improve driving efficiency. For example, the value of the pre-tilt angle may be based on the value of the fixed voltage, the stiffness of one or more hinges that enable the mirror structure to be tilted about the tilt axis, a location of the first actuator and/or a location of the second actuator (e.g., distances from the tilt axis), and/or a geometry of the first actuator and/or the second actuator (e.g., a number or configuration of electrostatic stator combs and/or electrostatic rotor combs, a size and/or shape of electrostatic parallel plates).

As indicated above, FIG. 2 is provided as one or more examples. Other examples may differ from what is described with regard to FIG. 2.

Figure 3:
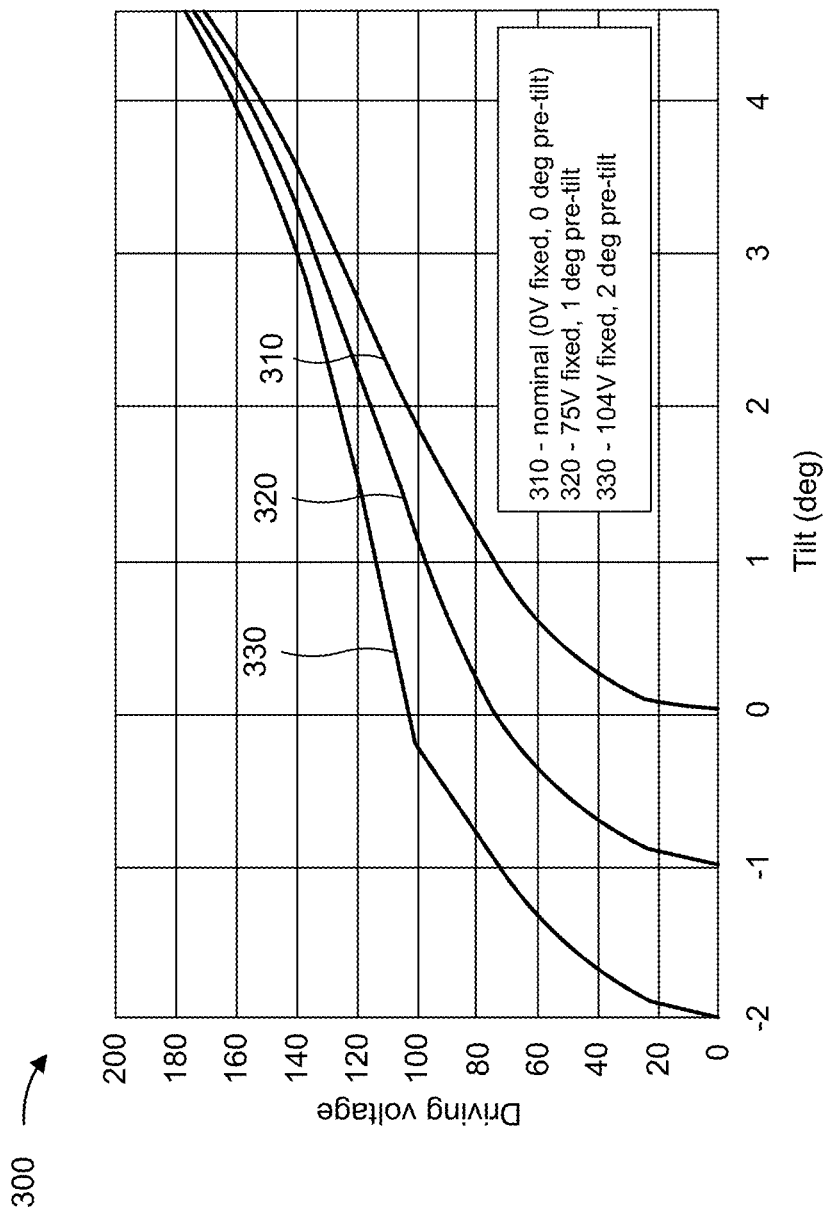
FIG. 3 is a plot of an example relationship between a driving voltage and a tilt angle associated with a mirror structure of a MEMS device described herein.

FIG. 3 is a plot 300 of an example relationship between a driving voltage and a tilt angle associated with a mirror structure of a MEMS device described herein. For example, curve 310 shows a relationship between a driving voltage and a tilt angle associated with a mirror structure in a MEMS device that includes a single driving channel to tilt the mirror structure about a tilt axis in a nominal design (e.g., when a fixed voltage is not applied to the fixed electrode). In this case, the mirror structure may have a tilt range of approximately 4.6 degrees with a maximum driving voltage of 170 volts. As shown by curve 320, applying a fixed voltage of 75 volts to the fixed electrode causes the mirror structure to pre-tilt by approximately 1 degree when no driving voltage is applied, resulting in a total tilt range of 5.45 degrees given the maximum driving voltage of 170 volts (e.g., 4.45 degrees plus 1 degree of pre-tilt). Similarly, as shown by curve 330, applying a larger fixed voltage of approximately 100 volts expands the pre-tilt angle to approximately 2 degrees, resulting in a total tilt range of approximately 6.35 degrees based on the maximum driving voltage of 170 volts (e.g., 4.35 degrees plus 2 degrees of pre-tilt). Accordingly, the electrode configuration with one fixed electrode and one driving electrode may generally reduce the maximum driving voltage that is needed to achieve a given tilt range. For example, at a fixed voltage of 75 volts, the necessary voltage to achieve a 4.6 degree total tilt range (e.g., as in the nominal design shown by curve 310) is about 150 volts, or 20 volts less than the nominal design. Furthermore, at a fixed voltage of approximately 100 volts, the voltage needed to achieve a 4.6 degree total tilt range (e.g., as in the nominal design shown by curve 310) is about 135 volts, or 35 volts less than the nominal design.

As indicated above, FIG. 3 is provided as one or more examples. Other examples may differ from what is described with regard to FIG. 3.

Figure 4:
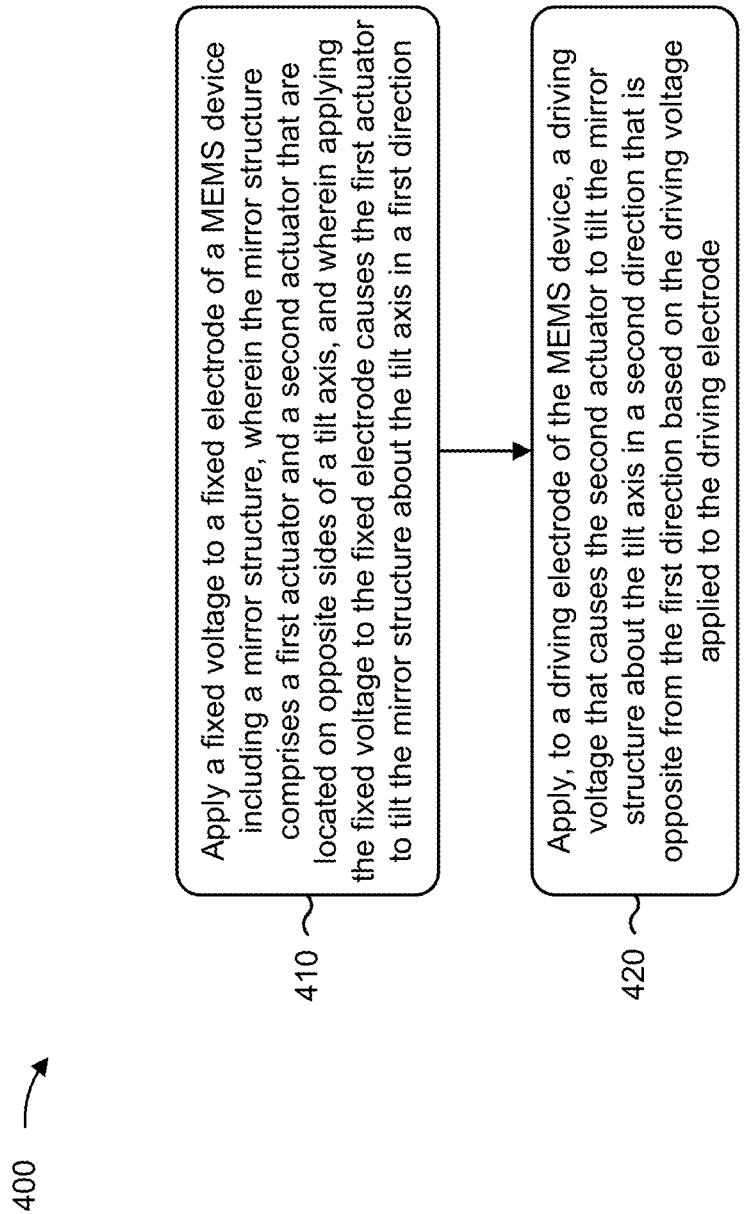
FIG. 4 is a flowchart of an example process relating to actuating a MEMS device that includes a tilting mirror structure.

FIG. 4 is a flowchart of an example process 400 relating to actuating a MEMS device that includes a tilting mirror structure. In some implementations, one or more process blocks of FIG. 4 may be performed by a MEMS driver circuit (e.g., a MEMS driver circuit that can cause one or more voltages to be applied to one or more electrodes of the MEMS device). In some implementations, one or more process blocks of FIG. 4 may be performed by another device or a group of devices separate from or including the MEMS driver circuit.

As shown in FIG. 4, process 400 may include applying a fixed voltage to a fixed electrode of a MEMS device including a mirror structure, wherein the mirror structure comprises a first actuator and a second actuator that are located on opposite sides of a tilt axis, and wherein applying the fixed voltage to the fixed electrode causes the first actuator to tilt the mirror structure about the tilt axis in a first direction (block 410). For example, as described above with reference to FIGS. 1A-1B, a MEMS device may include a mirror structure 110 that can be tilted about a tilt axis 125. In addition, the mirror structure 110 may include actuators 130, 140 located on opposite sides of the tilt axis 125.

Accordingly, in some implementations, the MEMS driver circuit may apply a fixed voltage to a fixed electrode 150 of the MEMS device, where the fixed electrode 150 is coupled to the actuator 140. In some implementations, applying the fixed voltage to the fixed electrode 150 causes the actuator 140 to tilt the mirror structure 110 about the tilt axis 125 in a first direction (e.g., toward the fixed electrode 150).

As further shown in FIG. 4, process 400 may include applying, to a driving electrode of the MEMS device, a driving voltage that causes the second actuator to tilt the mirror structure about the tilt axis in a second direction that is opposite from the first direction based on the driving voltage applied to the driving electrode (block 420). For example, the MEMS driver circuit may apply a driving voltage to a driving electrode 132 of the MEMS device, where the driving electrode 132 is coupled to actuator 130. In some implementations, the driving voltage causes the actuator 130 to tilt the mirror structure 110 about the tilt axis 125 in a second direction that is opposite from the first direction (e.g., toward the driving electrode 132) based on the driving voltage applied to the driving electrode 132, as described above.

Process 400 may include additional implementations, such as any single implementation or any combination of implementations described below and/or in connection with one or more other processes described elsewhere herein.

In a first implementation, applying the fixed voltage to the fixed electrode 150 causes the mirror structure 110 to tilt about the tilt axis 125 by a first angle having a value that is based on a value of the fixed voltage.

In a second implementation, alone or in combination with the first implementation, applying the driving voltage to the driving electrode 132 causes the mirror structure 110 to tilt about the tilt axis 125 by a second angle having a value that is based on a value of the driving voltage.

In a third implementation, alone or in combination with one or more of the first and second implementations, a tilt range of the mirror structure 110 is based on one or more of a value of the fixed voltage, a maximum value of the driving voltage, a stiffness of one or more hinges 120, 122 that enable the mirror structure 110 to be tilted about the tilt axis 125, one or more locations of one or more of the actuators 130, 140, or one or more geometries of one or more of the actuators 130, 140.

In a fourth implementation, alone or in combination with one or more of the first through third implementations, process 400 includes applying a negative bias voltage to a membrane of the mirror structure 110, wherein an effective voltage applied to the fixed electrode 150 is based on the fixed voltage and the negative bias voltage.

In a fifth implementation, alone or in combination with one or more of the first through fourth implementations, the actuators 130, 140 comprise respective sets of electrostatic combs and/or electrostatic parallel plates.

In a sixth implementation, alone or in combination with one or more of the first through fifth implementations, the MEMS device comprises a single driving channel to receive the driving voltage applied to the driving electrode 132.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

It will be apparent that systems and/or methods described herein may be implemented in different forms of hardware, firmware, or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A micro-electro-mechanical systems (MEMS) device, comprising:
   a mirror structure suspended from a first hinge and a second hinge that are arranged to enable the mirror structure to be tilted about a tilt axis,
      wherein the mirror structure comprises a first actuator and a second actuator located on opposite sides of the tilt axis;
   a driving electrode coupled to the second actuator; and a fixed electrode, coupled to the first actuator, to cause the mirror structure to tilt about the tilt axis in a first direction by a fixed pre-tilt angle when no voltage is applied to the driving electrode, the fixed pre-tilt angle being based on a non-zero pre-tilt voltage that includes a fixed voltage applied to the fixed electrode, wherein the driving electrode is configured
   to cause the mirror structure to tilt about the tilt axis in a second direction that is opposite from the first direction based on a driving voltage applied to the driving electrode.

2. The MEMS device of claim 1, wherein the fixed voltage applied to the fixed electrode causes the mirror structure to tilt about the tilt axis by the fixed pre-tilt angle in the first direction.

3. The MEMS device of claim 2, wherein a maximum value of the driving voltage applied to the driving electrode causes the mirror structure to tilt about the tilt axis by a second angle in the second direction such that a sum of the fixed pre-tilt angle and the second angle defines a tilt range of the mirror structure.

4. The MEMS device of claim 3, wherein the tilt range is based on one or more of a value of the fixed voltage, the maximum value of the driving voltage, a stiffness of one or more of the first hinge or the second hinge, one or more locations of one or more of the first actuator or the second actuator, or one or more geometries of one or more of the first actuator or the second actuator.

5. The MEMS device of claim 2, wherein the mirror structure comprises a membrane arranged to receive a negative bias voltage such that an effective voltage applied to the fixed electrode is based on the fixed voltage and the negative bias voltage.

6. The MEMS device of claim 1, wherein the first actuator comprises a first set of electrostatic combs and the second actuator comprises a second set of electrostatic combs.

7. The MEMS device of claim 1, wherein the first actuator comprises a first set of electrostatic parallel plates and the second actuator comprises a second set of electrostatic parallel plates.

8. The MEMS device of claim 1, further comprising:
   a driving channel comprising an interface to connect the driving electrode to a digital-to-analog converter configured to apply the driving voltage to the driving electrode.

9. A method, comprising:
   applying a fixed voltage to a fixed electrode of a micro-electro-mechanical systems (MEMS) device comprising a mirror structure,
      wherein the mirror structure comprises a first actuator and a second actuator that are located on opposite sides of a tilt axis, and
      wherein a non-zero pre-tilt voltage that is based on applying the fixed voltage to the fixed electrode causes the first actuator to tilt the mirror structure about the tilt axis in a first direction by a fixed pre-tilt angle when no voltage is applied to a driving electrode of the MEMS device; and applying, to the driving electrode of the MEMS device, a driving voltage that causes the second actuator to tilt the mirror structure about the tilt axis in a second direction that is opposite from the first direction based on the driving voltage applied to the driving electrode.

10. The method of claim 9, wherein applying the fixed voltage to the fixed electrode causes the mirror structure to tilt about the tilt axis by the fixed pre-tilt angle.

11. The method of claim 10, wherein applying the driving voltage to the driving electrode causes the mirror structure to tilt about the tilt axis by a second angle having a value that is based on a value of the driving voltage.

12. The method of claim 11, wherein a tilt range of the mirror structure is based on one or more of a value of the fixed voltage, a maximum value of the driving voltage, a stiffness of one or more hinges that enable the mirror structure to be tilted about the tilt axis, one or more locations of one or more of the first actuator or the second actuator, or one or more geometries of one or more of the first actuator or the second actuator.

13. The method of claim 10, further comprising:
   applying a negative bias voltage to a membrane of the mirror structure, wherein an effective voltage applied to the fixed electrode is based on the fixed voltage and the negative bias voltage.

14. The method of claim 9, wherein the first actuator comprises a first set of electrostatic combs or electrostatic parallel plates, and wherein the second actuator comprises a second set of electrostatic combs or electrostatic parallel plates.

15. The method of claim 9, wherein the MEMS device comprises a single driving channel to receive the driving voltage applied to the driving electrode.

16. A micro-electro-mechanical systems (MEMS) device, comprising:
a mirror structure configured to be tilted about a tilt axis;
a first actuator, located on a first side of the tilt axis, configured to cause the mirror structure to tilt about the tilt axis by a
fixed pre-tilt angle in a first direction when no voltage is applied to the second actuator, the fixed pre-tilt angle being based on a non-zero pre-tilt voltage applied to the first actuator; and a driving channel comprising the second actuator, located on a second side of the tilt axis, configured to cause the mirror structure to tilt about the tilt axis by a second angle in a second direction that is opposite from the first direction based on a driving voltage applied to a driving electrode provided in the driving channel,
wherein the mirror structure has a tilt range that is based on the non-zero pre-tilt voltage and a maximum value of the driving voltage.

17. The MEMS device of claim 16, wherein the non-zero pre-tilt voltage is based on a fixed voltage applied to a fixed electrode coupled to the first actuator.

18. The MEMS device of claim 16, wherein the non-zero pre-tilt voltage is based on a negative bias voltage applied to a membrane of the mirror structure.

19. The MEMS device of claim 16, wherein the non-zero pre-tilt voltage is based on a fixed voltage applied to a fixed electrode coupled to the first actuator and a negative bias voltage applied to a membrane of the mirror structure.

20. The MEMS device of claim 16, wherein the tilt range is based on a value of the non-zero pre-tilt voltage, the maximum value of the driving voltage, a stiffness of one or more hinges that enable the mirror structure to be tilted about the tilt axis, one or more locations of one or more of the first actuator or the second actuator, or one or more geometries of one or more of the first actuator or the second actuator.

* * * * *

UNITED STATES PATENT AND TRADEMARK OFFICE
CERTIFICATE OF CORRECTION

| | | |
|---|---|---|
| PATENT NO. | : 11,726,311 B2 | |
| APPLICATION NO. | : 17/247093 | |
| DATED | : August 15, 2023 | |
| INVENTOR(S) | : Gonzalo Wills et al. | |

It is certified that error appears in the above-identified patent and that said Letters Patent is hereby corrected as shown below:

In the Claims

In Claim 16, Column 11, Line 19, "applied to the second actuator," should be changed to --applied to a second actuator,--.

Signed and Sealed this
Twenty-sixth Day of September, 2023

Katherine Kelly Vidal
*Director of the United States Patent and Trademark Office*